(12) United States Patent
Hetzel et al.

(10) Patent No.: US 9,717,164 B2
(45) Date of Patent: Jul. 25, 2017

(54) CURRENT CONVERTER APPARATUS HAVING A MULTI-PHASE CURRENT CONVERTER

(71) Applicant: SIEMENS AKTIENGESELLSCHAFT, München (DE)

(72) Inventors: Brigitte Hetzel, Obermichelbach (DE); Marc Hiller, Lauf an der Pegnitz (DE); Anton Pfauser, Pommersfelden (DE); Gudrun Popp, Buckenhof (DE); Elfriede Schickert, Hessdorf (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 0 days.

(21) Appl. No.: 14/850,027

(22) Filed: Sep. 10, 2015

(65) Prior Publication Data

US 2016/0081202 A1 Mar. 17, 2016

(30) Foreign Application Priority Data

Sep. 11, 2014 (EP) ..................................... 14184362

(51) Int. Cl.
| | |
|---|---|
| *H05K 5/00* | (2006.01) |
| *H05K 7/20* | (2006.01) |
| *H05K 7/14* | (2006.01) |
| *H02M 7/155* | (2006.01) |

(52) U.S. Cl.
CPC ....... *H05K 7/20672* (2013.01); *H05K 5/0013* (2013.01); *H05K 7/1432* (2013.01); *H02M 7/1555* (2013.01); *H05K 7/20927* (2013.01)

(58) Field of Classification Search
CPC .................................................... H05K 7/1432
See application file for complete search history.

(56) References Cited

U.S. PATENT DOCUMENTS

| | | | |
|---|---|---|---|
| 6,259,616 B1 * | 7/2001 | Ekwall .................. | H02M 7/487 363/132 |
| 6,456,516 B1 * | 9/2002 | Bruckmann .......... | H02M 7/003 363/144 |

(Continued)

FOREIGN PATENT DOCUMENTS

| | | |
|---|---|---|
| DE | 2704781 A1 | 8/1978 |
| DE | 102011001786 A1 | 10/2010 |

(Continued)

*Primary Examiner* — Zachary M Pape
*Assistant Examiner* — Douglas Burtner
(74) *Attorney, Agent, or Firm* — Henry M. Feiereisen LLC

(57) ABSTRACT

A current converter apparatus includes a multi-phase current converter having current-converter modules for each phase that are electrically connected to one another and arranged in a current-converter cabinet. Each current-converter module has at least one semiconductor component arranged on a heat sink and includes just two semiconductor components connected to each other and connected to be controlled by a control component. The current-converter modules in the current-converter cabinet are arranged so that the current-converter modules of each current-converter phase form a horizontal row of modules arranged one beside the other and the rows are arranged vertically one above the other.

11 Claims, 7 Drawing Sheets

(56) References Cited

U.S. PATENT DOCUMENTS

| | | | |
|---|---|---|---|
| 8,385,068 B2* | 2/2013 | Jacobson | H01L 23/473 165/104.33 |
| 9,302,435 B2* | 4/2016 | Hatori | H02M 7/003 |
| 2001/0017825 A1* | 8/2001 | Schafer | G11B 33/0444 369/37.01 |
| 2003/0133267 A1* | 7/2003 | Beihoff | B60L 11/12 361/704 |
| 2007/0002594 A1* | 1/2007 | Otsuka | H02M 7/003 363/37 |
| 2007/0046252 A1 | 3/2007 | Aiello et al. | |
| 2007/0076355 A1* | 4/2007 | Oohama | H01L 25/117 361/676 |
| 2007/0183130 A1* | 8/2007 | Yamabuchi | H05K 7/1432 361/728 |
| 2008/0296897 A1* | 12/2008 | Kovach | F16H 39/02 290/44 |
| 2009/0174353 A1* | 7/2009 | Nakamura | B60L 11/1868 318/400.27 |
| 2009/0224706 A1* | 9/2009 | Jobard | B60L 3/0076 318/380 |
| 2010/0321896 A1 | 12/2010 | Yamada | |
| 2011/0302429 A1* | 12/2011 | Wang | G06F 1/263 713/300 |
| 2012/0327602 A1* | 12/2012 | Kulkarni | H02M 7/003 361/700 |
| 2013/0286618 A1* | 10/2013 | Shibasaki | H01L 23/049 361/772 |
| 2014/0036418 A1* | 2/2014 | Eichler | H05K 7/1432 361/605 |
| 2014/0161646 A1* | 6/2014 | Taillardat | H02P 27/14 417/410.1 |
| 2014/0197532 A1* | 7/2014 | Ide | H01L 23/36 257/706 |
| 2015/0029666 A1* | 1/2015 | Kosuga | H02M 3/28 361/699 |

FOREIGN PATENT DOCUMENTS

| | | |
|---|---|---|
| DE | 102011006987 A1 | 10/2012 |
| RU | 72181 U1 | 4/2008 |
| SU | 1835617 A1 | 8/1993 |

\* cited by examiner

CURRENT CONVERTER APPARATUS HAVING A MULTI-PHASE CURRENT CONVERTER

CROSS-REFERENCES TO RELATED APPLICATIONS

This application claims the priority of European Patent Application, Serial No. 14184362.3, filed Sep. 11, 2014, pursuant to 35 U.S.C. 119(a)-(d), the content of which is incorporated herein by reference in its entirety as if fully set forth herein.

BACKGROUND OF THE INVENTION

The invention relates to a current converter apparatus having a multi-phase current converter including a number of current converter modules electrically connected to one another for each current converter phase.

The following discussion of related art is provided to assist the reader in understanding the advantages of the invention, and is not to be construed as an admission that this related art is prior art to this invention.

Modular current converters are frequently installed in current-converter cabinets. If a current converter module is damaged, in the event of a short circuit in a current converter module, for instance, other current converter modules and even the entire interior of the current converter cabinet are frequently also contaminated or damaged, so that the current converter cabinet has to be cleaned in a time-consuming and costly manner and/or current converter modules or their busbars have to be replaced.

It would be desirable and advantageous to provide an improved current converter apparatus which obviates prior art shortcomings and which is compact in size and incurs less maintenance and repair costs.

SUMMARY OF THE INVENTION

In accordance with the invention, a current converter apparatus having a multi-phase current converter includes a number of current converter modules for each current converter phase that are electrically connected to one another, and a current converter cabinet, in which the current converter apparatus is installed. Each current converter module has a heat sink and at least one semiconductor component arranged on the heat sink. The current converter modules are arranged in the current converter cabinet such that the current converter modules of each current converter phase form a horizontal row of current converter modules arranged one beside the other and the module rows of the different current converter phases are arranged vertically one above the other.

Arrangement of the current converter modules of the apparatus in rows of modules that are arranged one above the other, provides a space-saving arrangement of the current converter modules. In this way, more current converter modules can be arranged in a current converter cabinet of a predetermined size. Alternatively, a current-converter cabinet is provided for a predetermined number of current converter modules that is smaller, and thus lighter, than is possible with conventional arrangements. This space and weight saving is particularly advantageous when the current converter apparatus is used on a ship, for instance, or in similar space or weight-restricted environments. Moreover, the assignment of individual module rows to the current converter phases allows for a simplified busbar connections of the current converter apparatus to the electrical connections of the current converter modules, as is explained below in more detail.

According to another advantageous feature of the present invention, at least one current-converter module can be encapsulated in a current-converter cell. Advantageously, at least one current-converter cell can include a cell housing made of polycarbonate or polymethyl methacrylate.

The encapsulation of current-converter modules in individual current-converter cells advantageously allows the effects of damage to an individual current-converter module, particularly damage due to short-circuits, to be localized, so that damage of this type does not influence adjacent current-converter modules. The maintenance and repair costs for the current-converter apparatus are advantageously reduced as a result. Current-converter cells having polycarbonate or polymethyl methacrylate cell housings are particularly advantageous in such a case, since such cell housings shield the current converter modules particularly well from one another.

According to another advantageous feature of the present invention, the module rows can be electrically connected to a vertically-oriented DC-link bus bar and/or the current-converter modules in each module row can be electrically connected to a horizontally-oriented bus bar for the phase. These embodiments of the invention can be used advantageously such that the current-converter modules of a module row are assigned in each instance to a current-converter phase. As a result a DC-link bus bar that runs vertically is sufficient to electrically connect the current converter phases and a phase bus bar that runs horizontally connects each current converter phase.

According to another advantageous feature of the present invention, the semiconductor components of the current-converter module can each be a bipolar transistor having an insulated gate electrode, or can each be a diode. A bipolar transistor with an insulated gate electrode (IGBT=Insulated-Gate Bipolar Transistor) is particularly advantageous and suitable as a semiconductor component for the current converter modules because of its good transfer function, its high blocking voltage, its robustness and its powerless control. Nevertheless not all semiconductor components of the current converter module have to be embodied as IGBTs. Instead of IGBTs, some current-converter modules can also have significantly more cost-effective diodes. Corresponding circuits are explained in the exemplary embodiments described below.

According to another advantageous feature of the present invention, at least one first current-converter module can have just two first semiconductor components that are connected electrically in parallel or in series with one another, with the semiconductor components each being configured as an IGBT and just one control module that can control these two semiconductor components. These embodiments are advantageous since both IGBTs are controlled by a shared control module, only one control module being required for the current-converter module. In contrast, conventional current-converter modules have a separate control module for each IGBT.

According to another advantageous feature of the present invention, each module row can include precisely three, four or five current converter modules.

Three current converter modules are generally adequate for the voltage range between approx. 2.3 kV and approx. 3.3 kV, four or five current converter modules are generally required for the voltage range between approximately 3.3 kV and approximately 7.2 kV.

According to another advantageous feature of the present invention, a rectifier can be arranged in the current-converter cabinet and connected electrically to the module rows, or a feed-return inverter can be arranged in the current-converter cabinet and connected electrically to the current converter. The feed-return inverter is also referred to as an Active Front End (AFE). The mains frequency of a supply network connected to the current converter can advantageously be adjusted in these embodiments of the current converter module by the rectifier or the feed-return inverter. A feed-return inverter also advantageously enables a return of energy into the supply network that is provided by a load operated using the current converter, e.g. a motor.

According to another advantageous feature of the present invention, a braking chopper can be arranged in the current-converter cabinet and connected to the module rows. The braking chopper is also referred to as braking unit. A braking chopper advantageously enables excess energy to be released, energy that cannot be fed into a supply network, in particular.

According to another advantageous feature of the present invention, a terminal cabinet can have terminals for electrical contact with the module rows that are electrically connected to the module rows. A terminal cabinet of this type is advantageous in that the current-converter cabinet does not need to be opened for making electrical contact with the current converter, for connecting the cables for instance. On the one hand, this facilitates electrically contacting the current converter. On the other hand, it advantageously prevents contamination of the current-converter cabinet by opening the current-converter cabinet for making electrical contact with the current converter.

BRIEF DESCRIPTION OF THE DRAWINGS

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
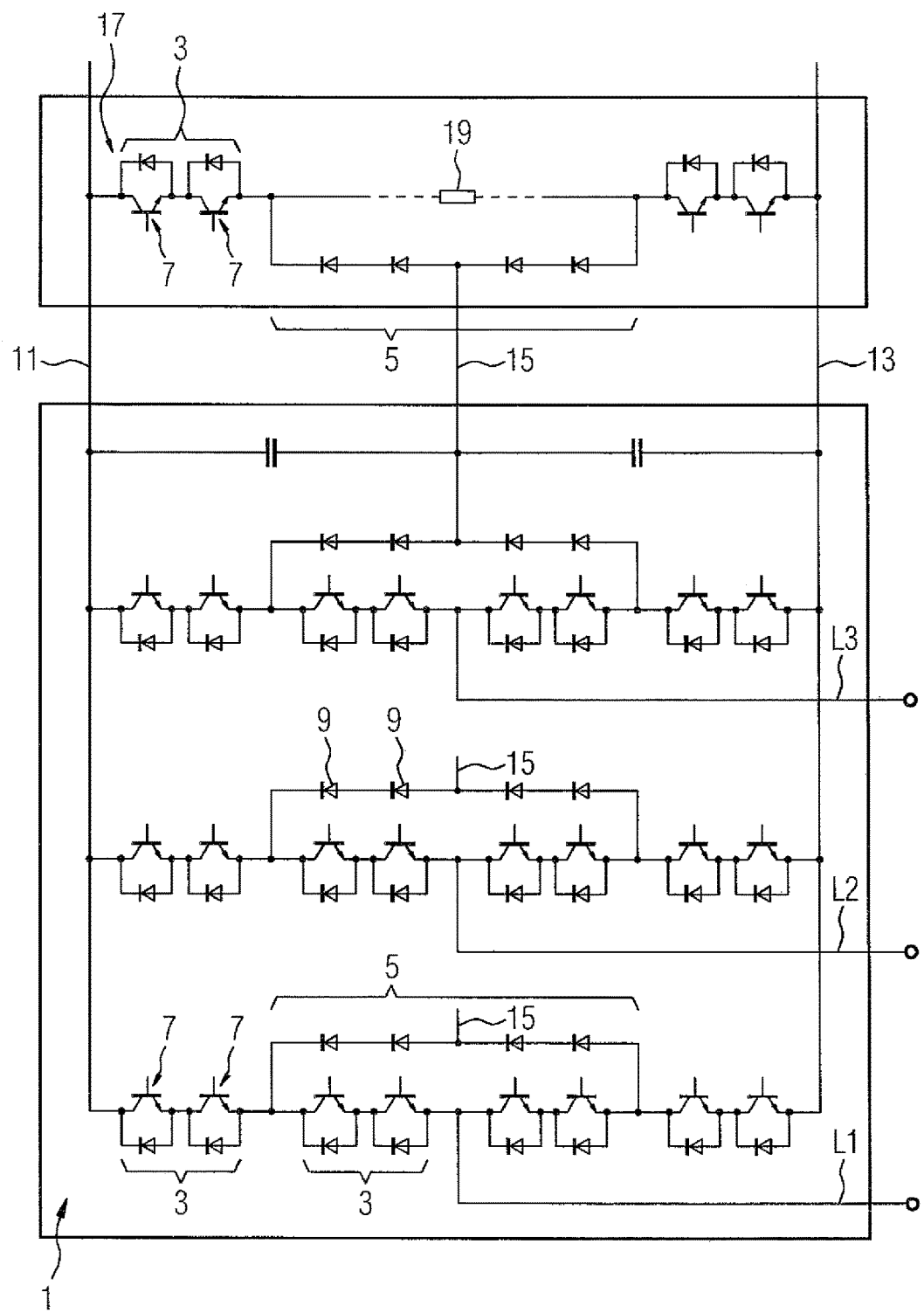
FIG. 1 is a circuit diagram of a three-phase current converter.

Throughout all the figures, same or corresponding elements may generally be indicated by same reference numerals. These depicted embodiments are to be understood as illustrative of the invention and not as limiting in any way. It should also be understood that the figures are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

Turning now to the drawing, and in particular to FIG. 1, there is shown a circuit diagram of a three-phase current converter 1. The current converter 1 has what is called a three-point inverter "in NPC topology" (NPC=Neutral Point Clamped). This three-phase current converter 1 has four first current-converter modules 3, a second-current converter module 5 and an exterior conductor L1, L2 L3 for each current-converter phase. Each first current-converter module 3 has two first semiconductor components 7 that are electrically connected in series with one another. The first semiconductor components 7 shown here are each a bipolar transistor that has an insulated gate electrode (IGBT=Insulated-Gate Bipolar Transistor). Each second current converter module 5 has four second semiconductor components 9 that are diodes, and electrically connected in series with one another.

In FIG. 1, the four first current converter modules 3 in each current-converter phase are connected electrically in series with one another. The second current converter module 5 of the respective current converter phase is connected electrically in parallel with the two inner first current converter modules 3 of this series circuit. Moreover, the series circuit of the first current converter module 3 is electrically connected between its two inner first current converter modules 3 to the outer conductors L1, L2, L3 of the respective current-converter phase.

One of the two outer first current converter modules 3 of each current converter phase is in each case electrically connected to a first DC link conductor 11. The other of the two outer first current converter modules 3 of each current converter phase is electrically connected to a second DC link conductor 13. A second current converter module 5 in each current converter phase is connected to a third DC link conductor 15. If the first DC link conductor 11 is disposed at a first, for instance positive electrical potential, the second DC link conductor 13 may be at a second, negative electrical potential, and the third DC link conductor 15 may then be at a third electrical potential, a zero potential in this instance.

FIG. 1 also shows a braking chopper 17. The braking chopper 17 has two first current converter modules 3, which are each embodied like the first current converter module 3 of the current converter phases. Of the two, one is connected to the first DC link conductor 11 and the other to the second DC link conductor 13. The two first current converter modules 3 of the braking chopper 17 are connected in series, with a braking chopper resistor 19 connected between them. The braking chopper 17 also includes a second current converter module 5, like the second current converter module 5 of the current converter phases, that is electrically connected in parallel with the braking chopper resistor 19 and also electrically connected to the third DC-link conductor 15.

Figure 2:
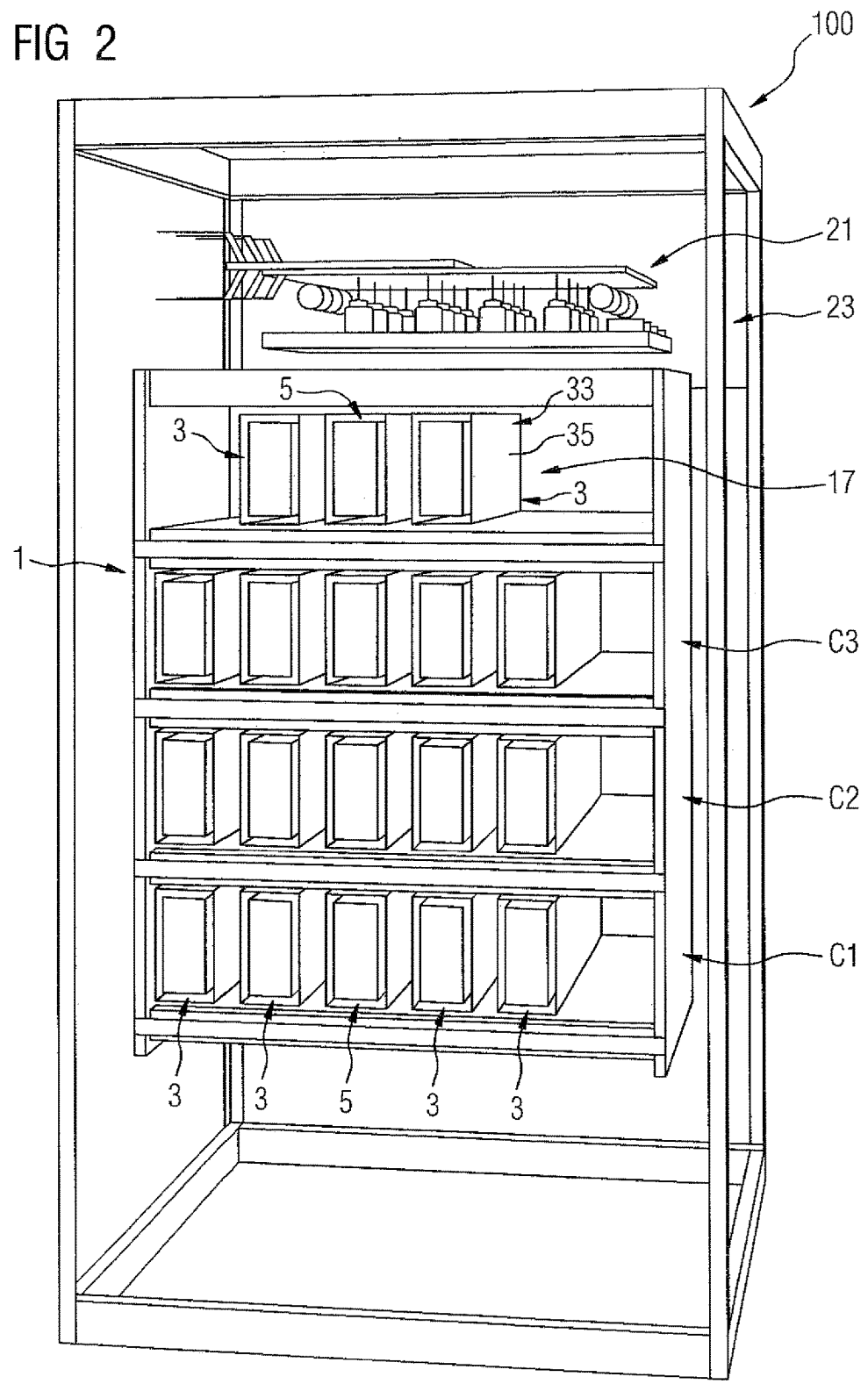
FIG. 2 is a schematic representation of a first exemplary embodiment of a current-converter apparatus.

FIG. 2 is a schematic perspective view of the front side of a first exemplary embodiment of current-converter apparatus in accordance with the invention. This current converter apparatus 100 includes a three-phase current converter 1, a braking chopper 17, a rectifier 21, and a current converter cabinet 23 in which the current converter 1 and the braking chopper 17 connected as shown in FIG. 1, and also connected to a rectifier 21, are arranged. The rectifier 21 shown here is a twelve-pulse rectifier.

Figure 4:
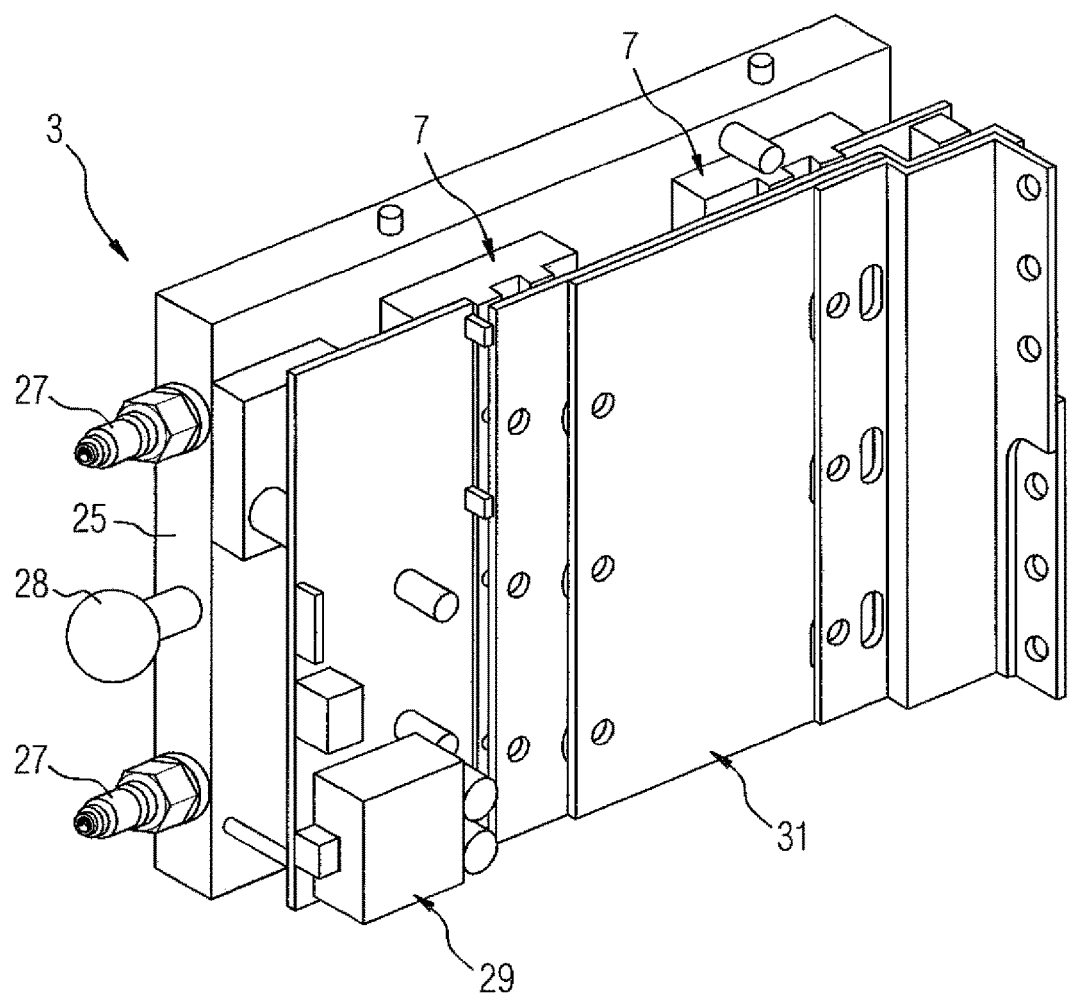
FIG. 4 shows a first current-converter module.

Each current converter module 3, 5, has a heat sink 25, shown in detail in FIG. 4, on which the semiconductor components 7, 9, of the respective current-converter module 3, 5, are arranged for cooling. Moreover each current-converter module 3, 5, is arranged in its own current converter cell 33, which has a cell housing 35 made of polycarbonate or polymethyl methacrylate, see also FIG. 5.

The current-converter modules 3, 5, are arranged in the current converter cabinet 23 such that the current-converter modules 3, 5, of each current-converter phase form a module row C1, C2, C3 of current converter-modules 3, 5, arranged horizontally one beside the other and the module rows C1, C2, C3 of the different current converter phases are arranged in tiers one above the other. In this way, a second current converter module 5 is in each case the central current converter module 3, 5, of each module row C1, C2, C3.

In FIG. 2, the braking chopper 17 is arranged in a separate tier of the current-converter cabinet 23, above the current-converter modules 3, 5, of the current-converter phases. The rectifier 21 is arranged in the cabinet above the braking chopper 17 in a further separate tier of the current-converter cabinet 23.

Figure 6:
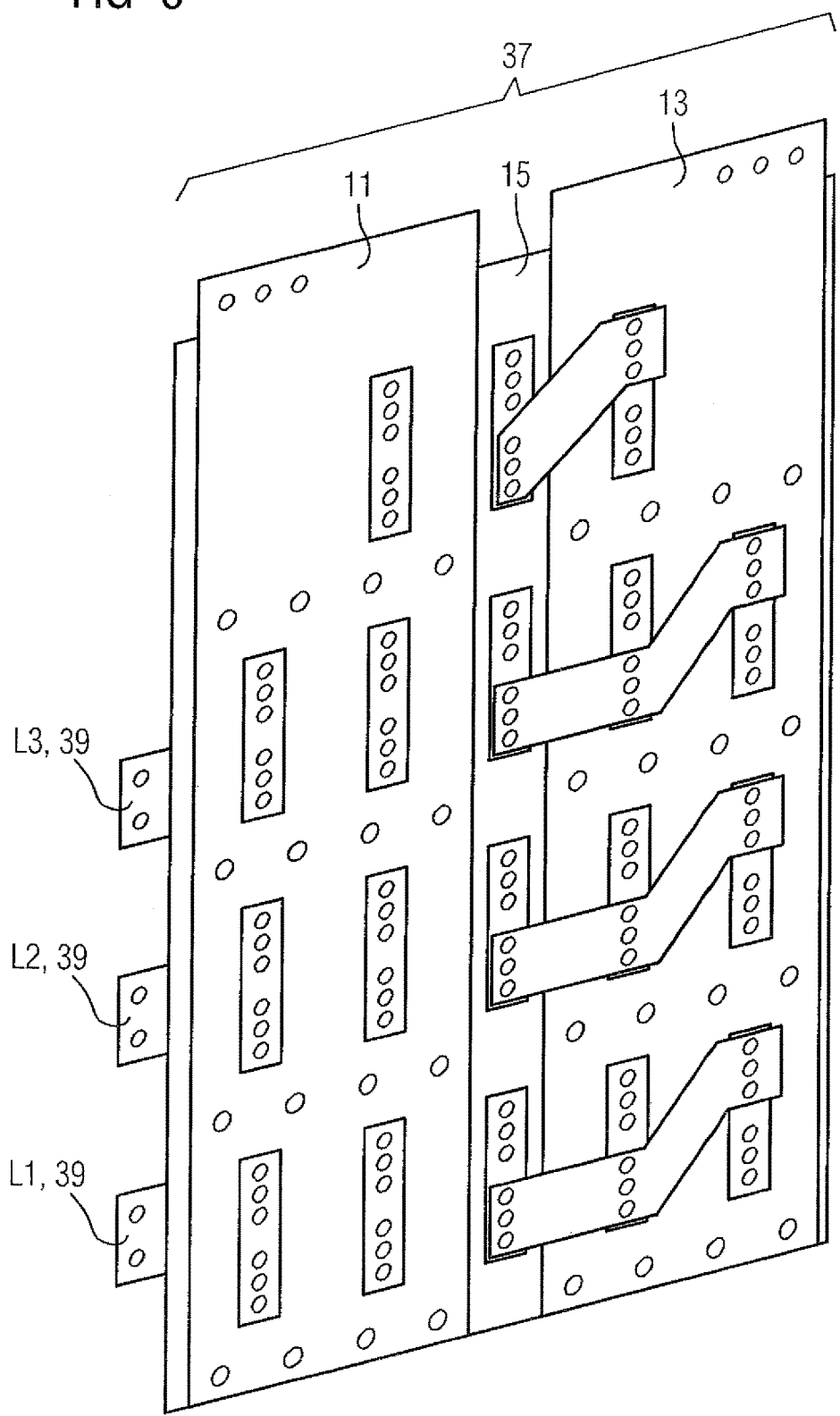
FIG. 6 is a view of a first side of a third DC-link bus bar.
Figure 7:
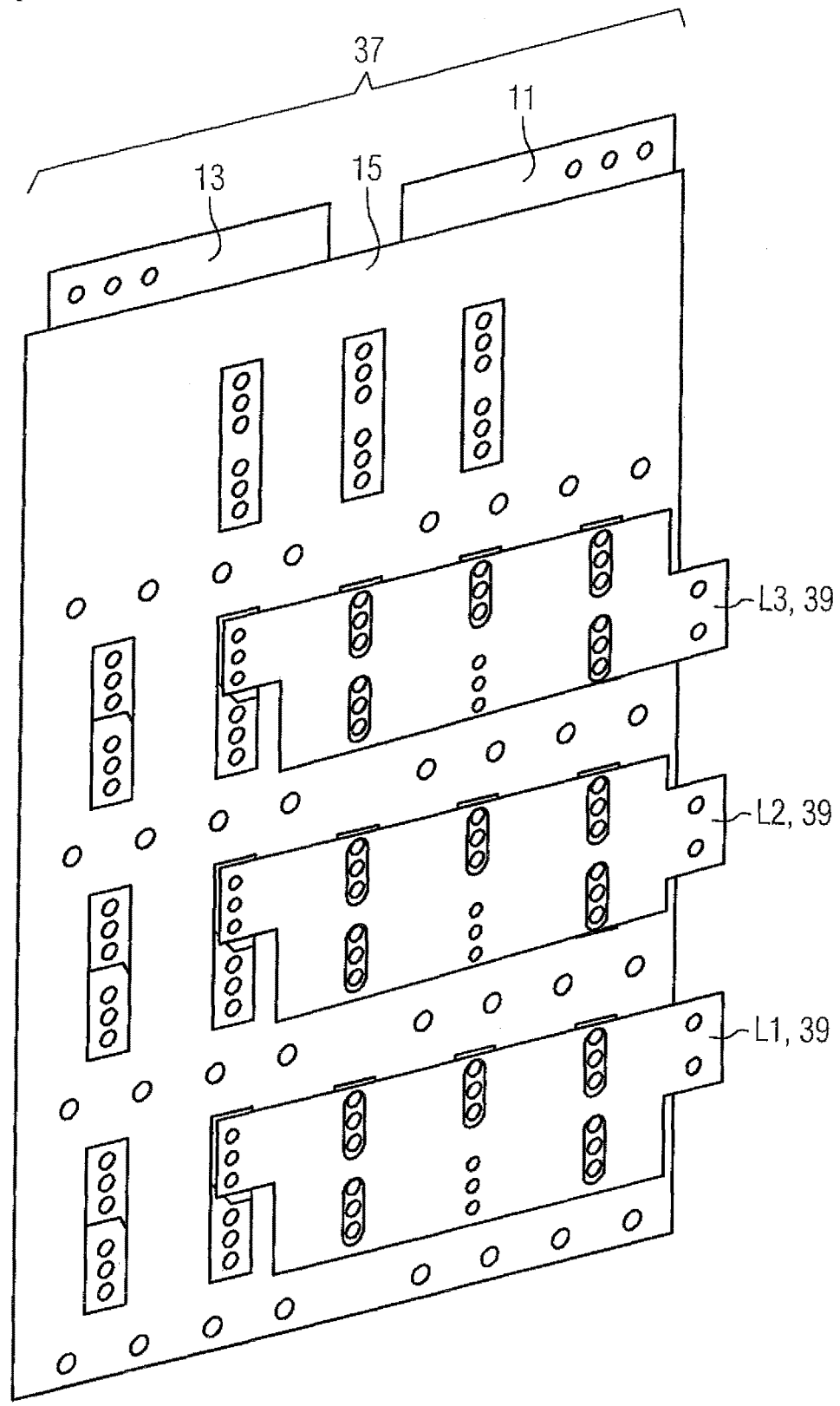
FIG. 7 is a view of the second side of the third DC-link bus bar.

The DC-link conductors 11, 13, 15, are provided by a DC-link bus bar 37 that runs vertically on the rear side of the current converter apparatus 100, and therefore are not visible in FIG. 2. The outer conductors L1, L2, L3, are phase bus bars 39 that run horizontally and are also arranged on the rear side of the current-converter apparatus 100, and are also not visible in FIG. 2. These connectors are shown in FIGS. 6 and 7. Plates that protect the bus bars 37, 39, are preferably arranged between the current-converter modules 3, 5, and the bus bars 37, 39.

Figure 3:
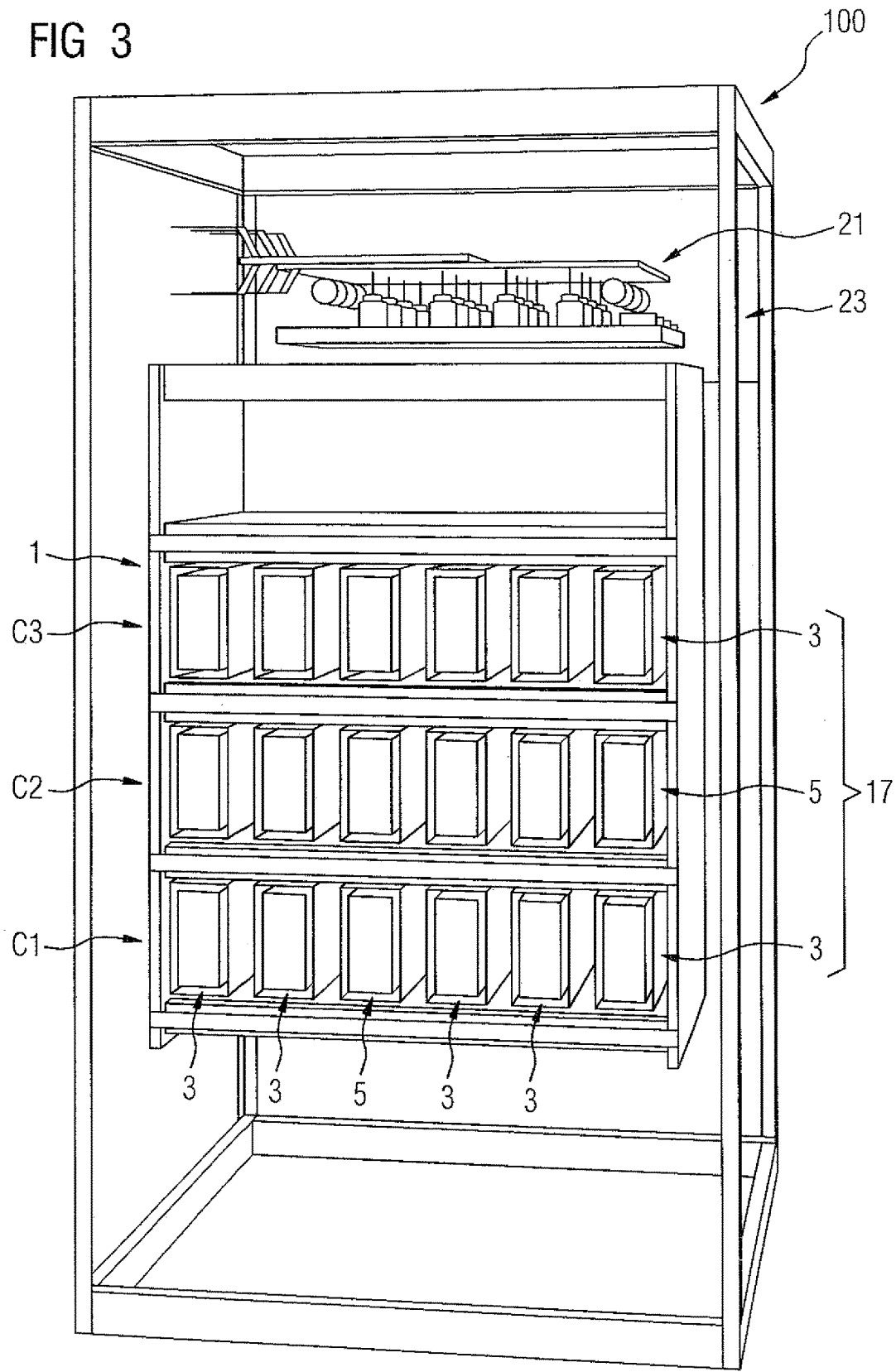
FIG. 3 is a schematic representation of a second exemplary embodiment of a current-converter apparatus.

FIG. 3 is a schematic perspective view of a second exemplary embodiment of the inventive current-converter apparatus 100. This embodiment differs from the one shown in FIG. 2 only in that the current-converter modules 3, 5, of the braking chopper 17 are not arranged on a separate tier of the current-converter cabinet 23. Instead, they are distributed over the tiers of the current-converter cabinet 23, in which the current-converter modules 3, 5, of the current-converter phases are arranged. The modules 3, 5, of the braking chopper 17 are thus arranged vertically above one another here, each in a different tier of the current-converter cabinet 23. The second current-converter module 5 of the braking chopper 17 is now vertically between the two first current-converter modules 3 of the braking chopper 17.

FIG. 4 is a perspective view of a first current converter module 3. The heat sink 25 is essentially a rectangular enclosure that receives a cooling liquid. It has two coolant connections 27 for supplying and discharging the cooling liquid, and a handle 28 that simplifies insertion and removal of the current-converter module 3 of the current-converter cell 33 is also optionally arranged on the heat sink 25. The first semiconductor components 7 are arranged on the heat sink 25. A control component 29 that controls the two semiconductor components 7 is arranged on the opposite side of a first semiconductor component 7 from the heat sink 25. The control component 29 has a control PCB (printed circuit board) populated with the relevant electronic components. The first current-converter module 3 also includes a module bus bar 31, that electrically connects the current-converter module 3 to other current-converter modules 3, 5, and to the DC-link bus bar 37 or a phase bus bar 39 (not shown here).

Figure 5:
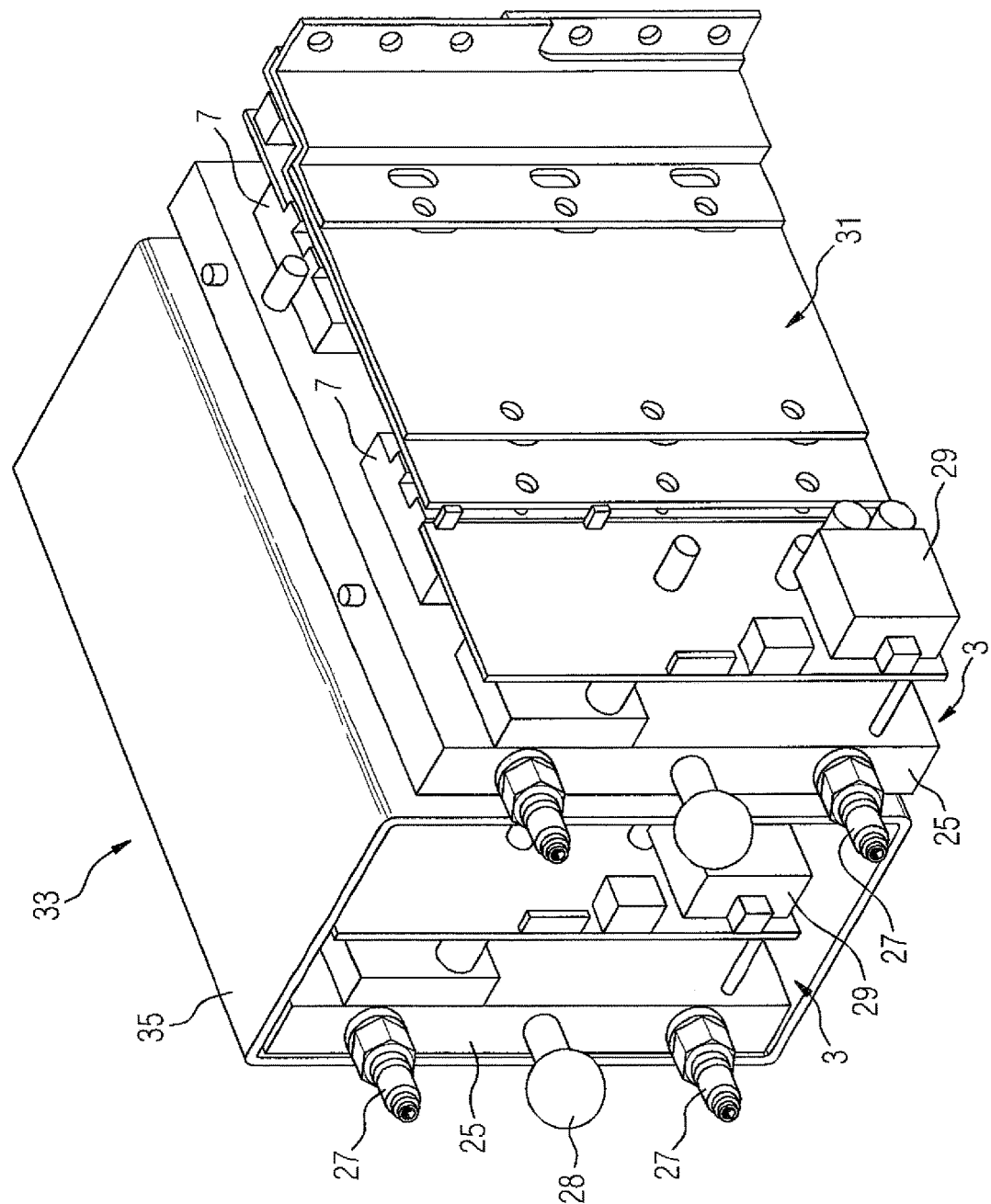
FIG. 5 shows two first current-converter modules and a housing.

FIG. 5 is a perspective view of two first current-converter modules 3 arranged adjacent to one another. Each is similar to the first current converter module 3 shown in FIG. 4. In FIG. 5, one of the current converter modules 3 is shown inserted within a cell housing 35, while the other has no cell housing 35. The cell housing 35 is an open, hollow rectangular cylinder, into which a current converter module 3 or 5 can be inserted.

FIGS. 6 and 7 are perspective views showing two opposite sides of a DC-link bus bar 37, having three phase bus bars 39 arranged thereon. The DC-link conductors 11, 13, 15, of the DC-circuit bus bar 37 and the phase bus bars 39 are plane-parallel electrically conductive plates, wherein the first DC-link conductor 11 and the second DC-link conductor 13 extend across a first side of the third DC-link conductor 15, and the phase bus bars 39 run on a first side of the third DC-link conductor 15. The first DC-link conductor 11 and the second DC-link conductor 13 extend in the horizontal direction at a distance away from one another over segments of the horizontal dimension of the second side of the third DC-link conductor 15 that are separate from one another. The first DC-link conductor 11 and the second DC-link conductor 13 extend in the vertical direction over the entire vertical height of the second side of the third DC-link conductor 15, protruding beyond an upper end of the third DC-link conductor 15.

The phase bus bars 39 extend horizontally, separated from one another in the vertical direction, over a horizontal segment of the height of the first side of the third DC-link conductor 15 and each phase bus bar protrudes beyond the third DC-link conductor 15 in the horizontal direction at one of its lateral ends.

A terminal cabinet that encloses electrical connections that are electrically connected to the electrical components in the current-converter cabinet 23, may also be installed adjacent to the current-converter cabinet 23 for electrically connecting with the components in the current-converter cabinet 23, for connecting cables, in particular.

An Active Front End (AFE) feed-return inverter may be used instead of the rectifier 21. The feed-return inverter may, for instance, include a corresponding number of current converter modules 3, 5, for each current converter phase, modules that correspond to the current converter modules 3, 5, of the respective current-converter phase described above. Preferably, the further current converter modules 3, 5 of the feed-return inverter are arranged in the same tier of the current converter cabinet 23 as the corresponding current-converter modules 3, 5, of the current-converter apparatus described above. Further alternative embodiments provide for heat sinks 25 for air cooling the current converter modules 3, 5, instead of the heat sinks 25 that receive a cooling liquid. The air-cooled heat sinks 25 preferably have cooling ribs for discharging heat into the air.

While the invention has been illustrated and described in connection with currently preferred embodiments shown and described in detail, it is not intended to be limited to the details shown since various modifications and structural changes may be made without departing in any way from the spirit and scope of the present invention. The embodiments were chosen and described in order to explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein.

What is claimed is:

1. Current-converter apparatus for a multi-phase current, said current-converter apparatus comprising:

multiple current-converter modules for each current-converter phase that are electrically connected to one another;

a heat sink in each current-converter module;

at least one semiconductor component arranged on each heat sink in each current-converter module; and a current-converter cabinet, the current converter modules for each phase being arranged horizontally in a respective row in the current converter cabinet, one beside the other, the module rows for the respective current converter phases being arranged vertically, one above the other, wherein at least one first current converter module has just one control component and just two first semiconductor components, the two first semiconductor components being electrically connected in parallel or in series with one another, each first semiconductor component being an insulated gate bipolar transistor, the two first semiconductor components being electrically connected to be controlled by the control component, wherein at least one second current converter module has four second semiconductor components, the four second semiconductor components being electrically connected in series with one another, each second semiconductor component being a diode.

2. The current-converter apparatus of claim 1, further comprising a current-converter cell encapsulating at least one of the current converter modules.

3. The current-converter apparatus of claim 2, further comprising at least one cell housing made of polycarbonate or polymethyl methacrylate, said cell housing enclosing a current-converter cell.

4. The current-converter apparatus of claim 1, further comprising a DC-link bus bar electrically connecting module rows, said DC-link bus bar running vertically between rows.

5. The current-converter apparatus of claim 1, further comprising a phase bus bar electrically connecting the current converter modules of each module row, said phase bus bar running horizontally along the row.

6. The current-converter apparatus of claim 1, further comprising an insulated gate electrode bipolar transistor or a diode in each current-converter module.

7. The current-converter apparatus of claim 1, wherein the current-converter module rows for each phase all have precisely three or four or five current-converter modules.

8. The current-converter apparatus of claim 1, further comprising a rectifier arranged in the current-converter cabinet and electrically connected to the current-converter module rows.

9. The current-converter apparatus of claim 1, further comprising a feed-return inverter arranged in the current-converter cabinet and electrically connected to the current converter.

10. The current-converter apparatus of claim 1, further comprising a braking chopper arranged in the current-converter cabinet and connected to the module rows.

11. The current-converter apparatus of claim 1, further comprising a terminal cabinet, having terminals electrically connected to the module rows making electrical contact with the module rows.

* * * * *